United States Patent
Kim (10) Patent No.: US 9,107,320 B2
(45) Date of Patent: Aug. 11, 2015

(54) DISPLAY APPARATUS

(71) Applicant: Min Cheol Kim, Yongin (KR)

(72) Inventor: Min Cheol Kim, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 244 days.

(21) Appl. No.: 13/721,791

(22) Filed: Dec. 20, 2012

(65) Prior Publication Data

US 2013/0201640 A1 Aug. 8, 2013

(30) Foreign Application Priority Data

Feb. 2, 2012 (KR) .................. 10-2012-0010941

(51) Int. Cl.
*H05K 1/14* (2006.01)
*H05K 1/02* (2006.01)
*H05K 1/18* (2006.01)

(52) U.S. Cl.
CPC .............. *H05K 1/147* (2013.01); *H05K 1/02* (2013.01); *H05K 1/189* (2013.01); *H05K 2201/10128* (2013.01)

(58) Field of Classification Search
CPC .............. H05K 1/189; H05K 2201/10128
USPC .......................... 361/749; 345/205
See application file for complete search history.

(56) References Cited

U.S. PATENT DOCUMENTS

| 4,411,633 | A | * | 10/1983 | Waldron | ............... 445/24 |
| 7,542,105 | B2 | * | 6/2009 | Sato et al. | ............... 349/58 |
| 8,305,514 | B2 | * | 11/2012 | Shinn et al. | ............... 349/58 |
| 2002/0000979 | A1 | * | 1/2002 | Furuhashi et al. | ...... 345/173 |
| 2008/0246744 | A1 |   | 10/2008 | Park et al. |   |
| 2011/0261540 | A1 | * | 10/2011 | Hsu | ................ 361/749 |
| 2011/0267320 | A1 | * | 11/2011 | Hu | ................ 345/204 |
| 2012/0050958 | A1 | * | 3/2012 | Sanford et al. | ...... 361/679.01 |
| 2013/0082984 | A1 | * | 4/2013 | Drzaic et al. | ............. 345/204 |

FOREIGN PATENT DOCUMENTS

| KR | 10 2007-0063242 A | 6/2007 |
| KR | 10 2008-0091609 A | 10/2008 |
| KR | 10 2011-0088979 A | 8/2011 |

* cited by examiner

*Primary Examiner* — William H Mayo, III
*Assistant Examiner* — Hiram E Gonzalez
(74) *Attorney, Agent, or Firm* — Lee & Morse, P.C.

(57) ABSTRACT

A display apparatus includes a flexible display panel including a display area that displays an image and a non-display area adjacent to at least a part of the display area, a driver circuit unit connected to the non-display area and driving the flexible display panel, a cover member covering at least a part of the driver circuit unit and at least a part of the non-display area of the flexible display panel, and a fixing unit spaced apart from the driver circuit unit and overlapping the non-display area. The fixing unit is between the cover member and the flexible display panel and fixes the cover member and the flexible display panel.

20 Claims, 6 Drawing Sheets

DISPLAY APPARATUS

CROSS-REFERENCE TO RELATED APPLICATION

Korean Patent Application No. 10-2012-0010941, filed on Feb. 2, 2012, in the Korean Intellectual Property Office, and entitled: "Display Apparatus," is incorporated by reference herein in its entirety.

BACKGROUND

Advances in a display apparatus have been made in connection with a flat display panel market. Some of the advantages of a flat display are, e.g., that fabrication of the flat display may be easier. However, since a glass may be used as a substrate, the flat display may be thick and inflexible.

SUMMARY

Embodiments may be realized by providing a display apparatus that includes a flexible display panel including a display area that displays an image and a non display area adjacent to at least a part of the display area, a driver circuit unit connected to the non-display area and the driver circuit unit drives the flexible display panel, a cover member covering at least a part of the driver circuit unit and at least a part of the non-display area of the flexible display panel, and a fixing unit spaced apart from the driver circuit unit and overlapping the non display area. The fixing unit is between the cover member and the flexible display panel to fix the cover member and the flexible display panel.

The driver circuit unit may include a driver printed circuit board driving the flexible display panel, and a main flexible printed circuit board mounted at the driver printed circuit board and connected to the flexible display panel to transfer an electric signal output from the driver printed circuit board to the flexible display panel. The cover member may include a first cover member covering an upper part of the driver circuit unit, and a second cover member covering a lower part of the driver circuit unit.

The flexible display panel may include a third cover member covering a lateral side of the driver circuit unit. The third cover member may connect the first cover member and the second cover member. The first, the second, and the third cover members may be integrally formed into one unit as one continuous piece.

The flexible display panel may include a connection unit connecting the first cover member, the second cover member, and the third cover member via the first cover member, the second cover member, and the driver printed circuit board. The first, the second, and the third cover members and the connection member may include a metallic material. The connection unit may be connected to a ground.

The fixing unit may include a first fixing unit between the first cover member and the flexible display panel and the first fixing unit may fix the first cover member and the flexible display panel. The fixing unit may include a second fixing unit between the second cover member and the flexible display panel and the second fixing unit may fix the second cover member and the flexible display panel. The first and second fixing units may include a nonconductive material.

The first fixing unit may include a first surface adjacent to the first cover member, and a second surface adjacent to the flexible display panel. An area of the first surface may be greater than an area of the second surface. The first fixing unit may have a quadrangular pyramid shape. The first fixing unit may have a semicircular pillar shape having a first surface of a rectangular shape and the first surface may contact the first cover member.

The second fixing unit may include a first surface adjacent to the second cover member and a second surface adjacent to the flexible display panel. An area of the first surface may be greater than an area of the second surface. The first fixing unit may have a quadrangular pyramid shape. The second fixing unit may have a semicircular pillar shape having a first surface of a rectangular shape and the first surface may contact the second cover member.

The display apparatus may include a touch panel on at least one surface of the display panel and the touch panel corresponds to the display area and detects an external touch, and a touch flexible printed circuit board may connect the touch panel and the driver printed circuit board. The display panel may include one surface adjacent to the driver circuit unit and another surface opposite the one surface, the touch flexible printed circuit board may be bent along the other surface of the flexible display panel, and at least a part of the touch flexible printed circuit board may be on the other surface of the flexible display panel and may be in contact with the second fixing unit.

The touch flexible printed circuit board may be between a lower surface of the flexible display panel and the second surface of the second fixing unit. One surface of the touch flexible printed circuit board may contact with the second surface of the second fixing unit at a first area and the first area may have a same area as the area of the second surface of the fixing unit.

BRIEF DESCRIPTION OF THE FIGURES

Features will become apparent from the following description with reference to the following figures, wherein like reference numerals refer to like parts throughout the various figures unless otherwise specified, and wherein.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "between", "connected to", "coupled to", or "adjacent to" another element or layer, it can be directly on, between, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Below, a display apparatus according to an exemplary embodiment is fully described with reference to FIGS. 1 to 3.

Figure 1:
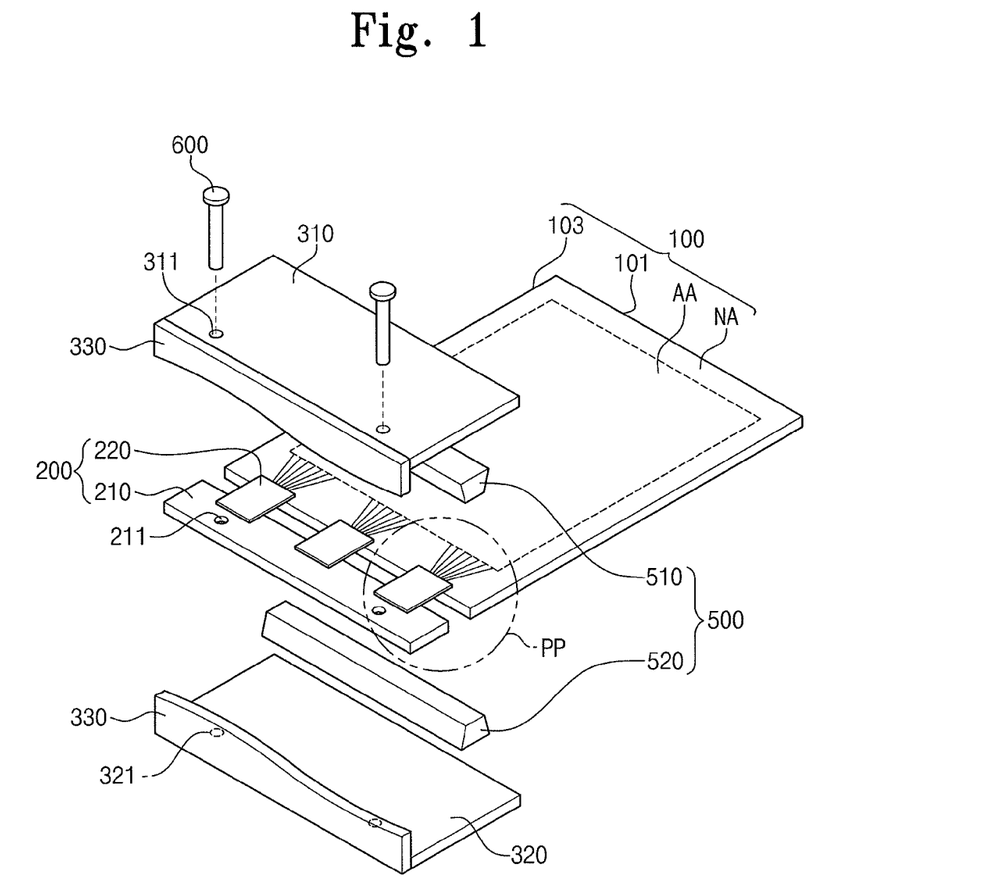
FIG. 1 illustrates an exploded perspective view of a display apparatus according to an exemplary embodiment.

FIG. 1 illustrates an exploded perspective view of a display apparatus according to an embodiment. FIG. 2 illustrates a top view of a display device according to an exemplary embodiment. FIG. 3 illustrates a cross-sectional view of the display device taken along a line I-I' in FIG. 2.

A display apparatus may include a display panel 100, a driver circuit unit 200, a cover member 300, a fixing unit 500, and a connection member 600.

The display panel 100 may include a display area AA displaying an image and a non-display area NA adjacent to at least a part of the display area AA. The display panel 100 may have a rectangular shape having two short edges 101 and two long edges 103. The display panel 100 may include one of various types of display panels such as a liquid crystal display (LCD) panel, an electrophoretic display panel (EDP), an organic light-emitting display (OLED) panel, a plasma display panel (PDP), and the like. An exemplary embodiment of the display panel 100 including the OLED panel is described herein.

Although not shown in the figures, the display panel 100 may include a flexible substrate including a plurality of pixels areas therein. For example, the display panel 100 may be a flexible display panel. For example, the flexible substrate may include a thin film transistor disposed on the flexible substrate, gate lines, data lines, pixel electrodes, organic light emitting diodes, and the like for forming a plurality of pixels.

For example, the flexible substrate may include gate lines, data lines intersecting the gate lines, thin film transistors arranged at pixel areas and turned on by gate-on voltages supplied from the gate lines to output data voltages supplied from the data lines. The flexible substrate may include pixel electrodes supplied with the data voltages output from the thin film transistors, and organic light emitting diodes arranged to correspond to the thin film transistors. The organic light emitting diodes may display an image corresponding to data voltages received from the pixel electrodes.

The display panel 100, e.g., the flexible display panel 100, may further include a bonding pad (not shown) at the non-display area NA. The bonding pad may have a plurality of thin film patterns (not shown). Electrical signals supplied from the driver circuit unit 200 may be provided to the gate lines and the data lines that are connected to the plurality of thin film patterns via the bonding pad.

The flexible substrate may include and/or may be formed of a flexible material. For example, a polymer resin may be used as the flexible material. The polymer resin include a polyimide, a polyethylene naphthalate (PEN), a polyethylene terephthalate (PET), a polycarbonate (PC), a polyether sulfone (PES), a polyarylate (PAR), and/or a poly cyclic olefin (PCO).

Although not shown in the figures, the display apparatus according to an exemplary embodiment may further include a polarization film on one surface of the display panel 100, e.g., on the one surface where an image is displayed. A visibility of the display apparatus may be improved by the polarization film.

The driver circuit unit 200 may include a driver printed circuit board 210 and a main flexible printed circuit board 220.

The main flexible printed circuit board 220 may connect the driver printed circuit board 210 and the display panel 100, e.g., the flexible display panel 100, electrically. A first side of the main flexible printed circuit board 220 may be electrically connected to the driver printed circuit board 210. A second side of the main flexible printed circuit board 220 may be electrically connected to the bonding pad of the display panel 100. The first side may be opposite the second side. An anisotropic conductive film (ACF) may be disposed between the second side of the main flexible printed circuit board 220 and display panel 100 (for example, the bonding pad of the display panel 100). An electric signal output from the driver printed circuit board 210 by the anisotropic conductive film may be transferred to the display panel 100 via the main flexible printed circuit board 220.

The main flexible printed circuit board 220 may be a Chip On Film (COF). A driver chip 225 (FIG. 3) may be disposed on one surface of the main flexible printed circuit board 220.

In FIG. 1, there is illustrated the case that the display apparatus includes three main flexible printed circuit board 220. However, embodiments are not limited thereto, e.g., the display apparatus may include at least one or more main flexible printed circuit boards. In this case, the number of main flexible printed circuit boards may not be limited.

The driver printed circuit board 210 may be disposed to be spaced apart from the display panel 100, e.g., by a predetermined distance. As described above, the driver printed circuit board 210 may drive the display panel 100, e.g., the flexible display panel 100. The driver printed circuit board 210 may include at least a first connection hole 211. In FIG. 2, there is illustrated the case that the driver printed circuit board 210 includes two first connection holes 211. However, embodiments are not limited thereto, e.g., the driver printed circuit board 210 may include at least one or more first connection holes. In this case, the number of first connection holes may not be limited.

The cover member 300 may cover at least a part of the driver circuit unit 200 and at least a part of the non-display area NA of the display panel 100, e.g., the flexible display panel 100. The cover member 300 may include a first cover member 310, a second cover member 320, and a third cover member 330. The first, second, and third cover members 310, 320, and 330 may be integrally formed as one continuous piece or may be assembled together to form the cover member 300.

The first cover member 310 may cover a top of the driver circuit unit 200. The first cover member 310 may be overlapped with a part of the non-display area NA of the display panel 100 on a plane. A shape of the first cover member 310 is not limited to this disclosure. For example, the first cover member 310 may be provided to have a shape of a flat board that is parallel with the display panel 100 and has an upper surface and a lower surface.

The first cover member 310 may be formed of a metallic material.

The first cover member 310 may include at least one or more second connection holes 311 corresponding to the at least one or more first connection holes 211. In FIG. 1, there is illustrated the case that the first cover member 310 has two second connection holes 311. However, embodiments are not limited thereto, e.g., the first cover member 310 may include at least one or more second connection holes. In this case, the number of second connection holes may not be limited and may correspond to the number of first connection holes 211.

The second cover member 320 may cover a bottom of the driver circuit unit 200. The second cover member 320 may be overlapped with a part of the non-display area NA of the display panel 100 on a plane. A shape of the second cover member 320 is not limited to this disclosure. For example, the second cover member 320 may be provided to have a shape of a flat board that is substantially parallel with the display panel 100, e.g., the flexible display panel 100, and has an upper surface and a lower surface.

The second cover member 320 may be formed of a metallic material. For example, the same metallic material as the first cover member 310.

The second cover member 320 may include at least one or more third connection holes 321 that correspond to the at least one or more first connection holes 211 and the at least one or more second connection holes 311. In FIG. 1, there is illustrated the case that the second cover member 320 has two third connection holes 321. However, embodiments not limited thereto, e.g., the second cover member 320 may include at least one or more third connection holes. In this case, the number of third connection holes may not be limited and may correspond to the number of first and second connection holes 211 and 311.

The third cover member 330 may cover a lateral part, e.g., overlap an entire lateral end, of the driver circuit unit 200. The third cover member 330 may connect the first cover member 310 and the second cover member 320 to each other. A shape of the third cover member 330 is not limited to this disclosure. For example, the third cover member 330 may have a shape of a flat board that is vertical to the display panel 100 and/or vertical to the first and second cover members 310 and 320.

The third cover member 330 may be formed of a metallic material. For example, the same metallic material as at least one of the first and second cover members 310 and 320.

Figure 2:
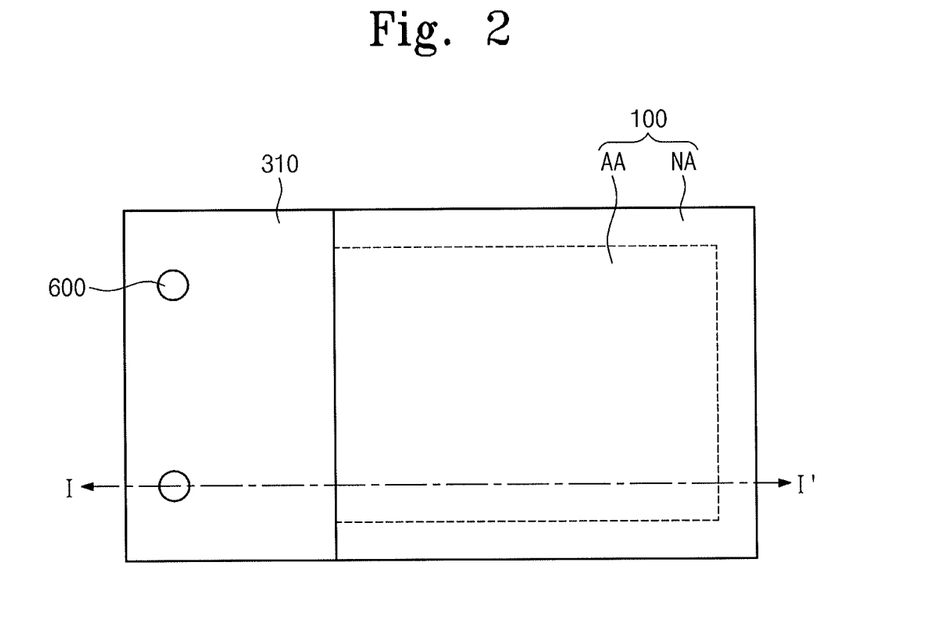
FIG. 2 illustrates a top view of a display device according to an exemplary embodiment.
Figure 3:
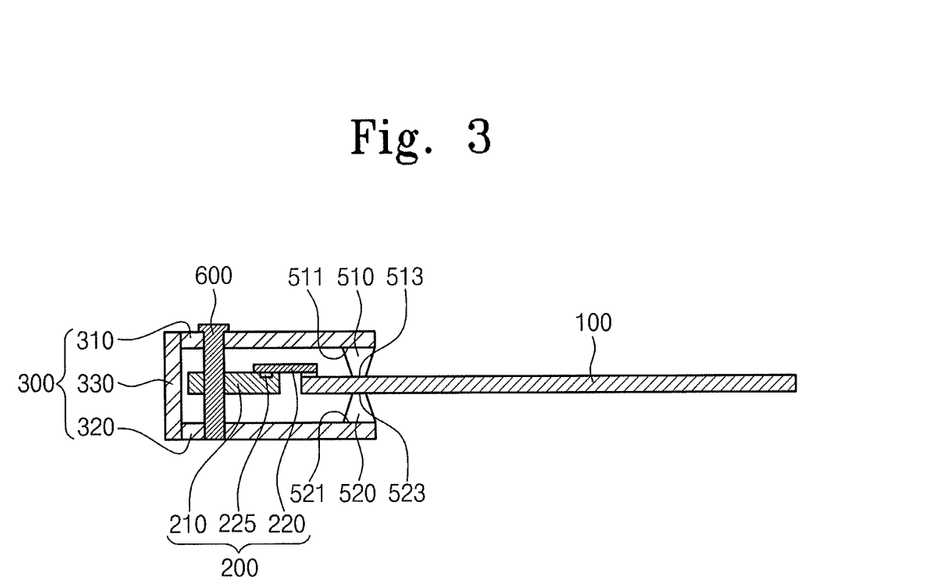
FIG. 3 illustrates a cross-sectional view of the display device taken along a line I-I' in FIG. 2.

In the exemplary embodiment described in relation to FIGS. 1 to 3, the cover member 300 may be described under the condition that it is formed of the first, second and third cover members 310, 320, and 330. In other example embodiments, the first, second, and third cover members 310, 320, and 330 can be formed in one unit, e.g., as one continuous piece. In this case, the first, second and third cover members 310, 320, and 330 may be formed of the same metallic material. In other exemplary embodiments, at least one of the first, second, and third cover members 310, 320, and 330 may be affixed, e.g., by a fastening member, to another of the first, second, and third cover members 310, 320, and 330.

The fixing unit 500 may be spaced apart from the driver circuit unit 200 and may correspond to a part of the non-display area NA of the display panel 100. The fixing unit 500 may be disposed between the cover member 300 and the display panel 100. The fixing unit 500 may fix the flexible display panel 100.

The fixing unit 500 may include a first fixing unit 510 and a second fixing unit 520.

The first fixing unit 510 may be disposed between the first cover member 310 and the display panel 100. The first fixing unit 510 may fix together, e.g., by being in direct contact with, the first cover member 310 and the display panel 100. The first fixing unit 510 may be disposed to correspond to the non-display area NA of the display panel 100. The first fixing unit 510 may be spaced apart from the driver printed circuit board 210.

The first fixing unit 510 may include a first surface 511 adjacent to the first cover member 310 and a second surface 513 adjacent to the display panel 100. An area of the first surface 511 may be larger than an area of the second surface 513. The first surface 511 of the first fixing unit 510 may be in contact with the first cover member 310, and the second surface 513 of the first fixing unit 510 may be in contact with the display panel 100. In example embodiments, the first fixing unit 510 may have a quadrangular pyramid shape.

The first fixing unit 510 may be formed of a flexible and nonconductive material (e.g., a silicone or a rubber).

The second fixing unit 520 may be disposed between the second cover member 320 and the display panel 100. The second fixing unit 520 may fix together, e.g., by being in direct contact with, the second cover member 320 and the display panel 100. The second fixing unit 520 may be disposed to correspond to the non-display area NA of the display panel 100. The second fixing unit 520 may be spaced apart from the driver printed circuit board 210. The second fixing unit 520 may also be spaced apart from the first fixing unit 510, e.g., by the non-display area NA.

The second fixing unit 520 may include a first surface 521 adjacent to the second cover member 320 and a second surface 523 adjacent to the display panel 100. An area of the second surface 521 may be larger than an area of the second surface 523. The second surface 521 of the second fixing unit 520 may be in contact with the second cover member 320, and the second surface 523 of the second fixing unit 520 may be in contact with the display panel 100. In example embodiments, the second fixing unit 520 may have a quadrangular pyramid shape.

The second fixing unit 520 may be formed of a flexible and nonconductive material (e.g., a silicone or a rubber). For example, the second fixing unit 520 may be formed of the same material as the first fixing unit 510.

The connection member 600 may connect the first cover member 310, the second cover member 320, and the driver printed circuit board 210. For example, the connection member 600 may pass through the second connection hole 311, the first connection hole 211, and the third connection hole 321 sequentially from a top of the first cover member 310 toward a bottom of the second cover member 320. The connection member 600 may connect the first cover member 310, the second cover member 320, and the driver printed circuit board 210 to each other. The connection member 600 may be in contact with the first cover member 310, the second cover member 320, and the driver printed circuit board 210.

The connection member 600 may be a fastening member such as a bolt. The connection member 600 may be formed of a metallic material. The connection member 600 may be formed of the same material as the cover members 310, 320, and 330.

The connection member 600 may be grounded. The connection member 600 may be electrically connected to the cover members 310, 320, and 330, and the cover members 310, 320, and 330 may be grounded via the connection member 600.

Figure 4:
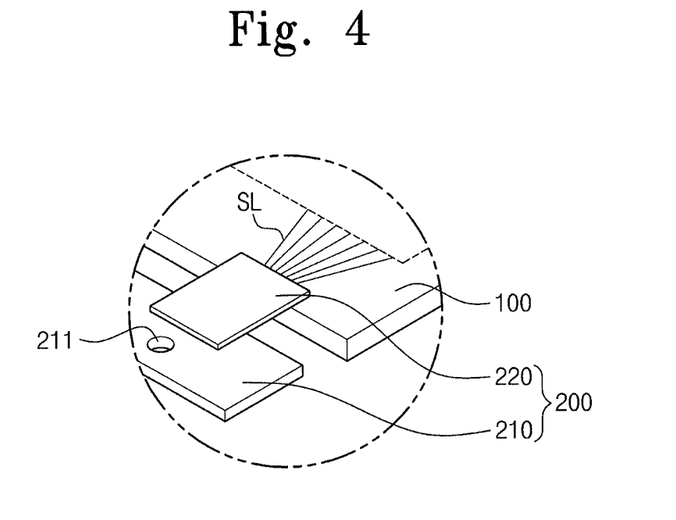
FIG. 4 illustrates a partial enlarged view of a portion of the display panel and driver circuit unit marked by a dotted circle PP in FIG. 1.

FIG. 4 is a partial magnifying view of a display panel and a driver circuit unit magnifying a portion marked by a dotted circle in FIG. 1.

Referring to FIG. 4, a plurality of single lines SL may be provided at a non-display area NA of a display panel 100. The signal lines SL may be extended to a display area AA of the display panel 100 to be connected to data lines or gate lines. Each of the signal lines SL may transfer an electric signal from the driver circuit unit 200 to a data line or a gate line.

A fixing unit 500 may be disposed to be overlapped with the signal lines SL on a plane. Although the display panel 100 is varied in shape, cracking of the signal lines SL prepared at the non-display area NA of the display panel 100 may be reduced and/or prevented by the fixing unit 500 disposed between a cover member 300 and the display panel 100.

Below, a display apparatus according to another exemplary embodiment will be described with reference to FIG. 5.

Figure 5:
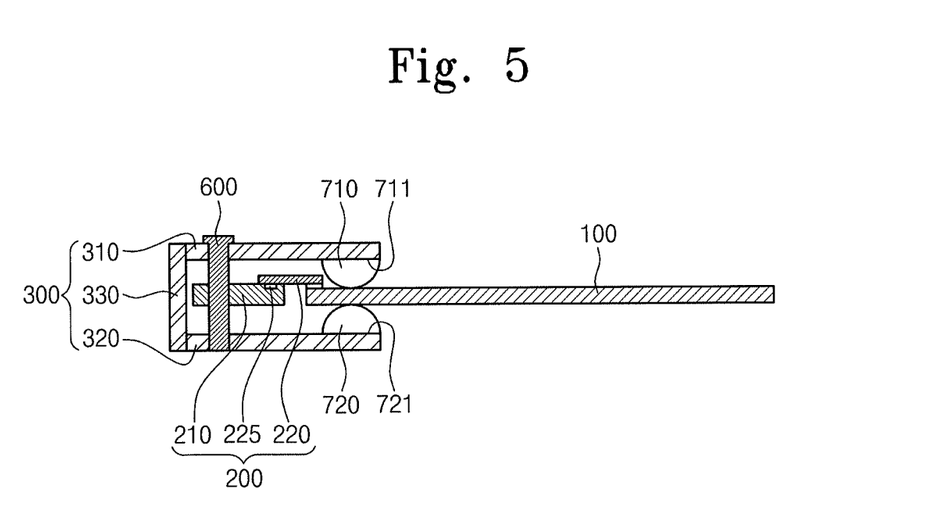
FIG. 5 illustrates a cross-sectional view of a display apparatus according to an exemplary embodiment.

FIG. 5 is a cross-sectional view of a display apparatus according to another exemplary embodiment. A display apparatus in FIG. 5 may be configured the same as a display apparatus described in relation to FIGS. 1 to 3 excepting for a shape of a fixing unit, and repeated description thereof are thus omitted.

The fixing unit may be spaced apart from a driver circuit unit 200, may correspond to a part of a non-display area NA, and may be disposed between the cover member 300 and the display panel 100.

The fixing unit may include a first fixing unit 710 and a second fixing unit 720. The first and second fixing units 710 and 720 may fix the flexible display panel 100.

The first fixing unit 710 may be disposed between the first cover member 310 and the display panel 100, and may fix the first cover member 310 and the display panel 100 together. The first fixing unit 710 may be disposed to correspond to the non-display area NA of the display panel 100.

The first fixing unit 710 may have a semicircular pillar shape, e.g., a semi-cylindrical shape. The first fixing unit 710 may include a first surface 711 having a rectangular shape, e.g., may be a substantially flat rectangular surface. The first surface 711 may be adjacent to the first cover member 310. The first surface 711 may face a concave portion of the first fixing unit 710. A lowermost part of the concave portion may be in contact with the display panel 100. A central axis of a semicircular pillar of the first fixing unit 710 may be disposed to be parallel with a short edge 101 (see FIG. 1) of the display panel 100. The first surface 711 of the first fixing unit 710 may be in contact with the first cover member 310.

In other example embodiments, the first fixing unit 710 may have a shape similar to the semicircular pillar shape. For example, the first fixing unit 710 may be configured such that a length to a surface of the first fixing unit 710 from a center of the first surface 711 of the first fixing unit 710 is not constant on a cross section of the concave portion of the first fixing unit 710.

The first fixing unit 710 may be formed of a flexible and nonconductive material (e.g., a silicone or a rubber).

The second fixing unit 720 may be disposed between a second cover member 320 and the display panel 100, and may fix the second cover member 320 and the display panel 100. The second fixing unit 720 may be disposed to correspond to the non-display area NA of the display panel 100.

The second fixing unit 720 may have a semicircular pillar shape, e.g., a shape similar to that of the first fixing unit 710. The second fixing unit 720 may include a first surface 721 having a rectangular shape, and the first surface 721 may be adjacent to the second cover member 320. A central axis of a semicircular pillar of the second fixing unit 720 may be disposed to be parallel with the short edge 101 (see FIG. 1) of the display panel 100. The first surface 721 of the second fixing unit 720 may contact with the second cover member 320.

In other example embodiments, the second fixing unit 720 may have a shape similar to a semicircular pillar. For example, the second fixing unit 720 may be configured such that a length to a surface of the second fixing unit 720 from a center of the first surface 721 of the second fixing unit 720 is not constant on a cross section that has a semicircular shape.

The second fixing unit 720 may be formed of a flexible and nonconductive material (e.g., a silicone or a rubber). The second fixing unit 720 may be formed of a same material as the first fixing unit 710.

Below, a display apparatus according to still another exemplary embodiment of will be described with reference to FIGS. 6 to 8.

Figure 6:
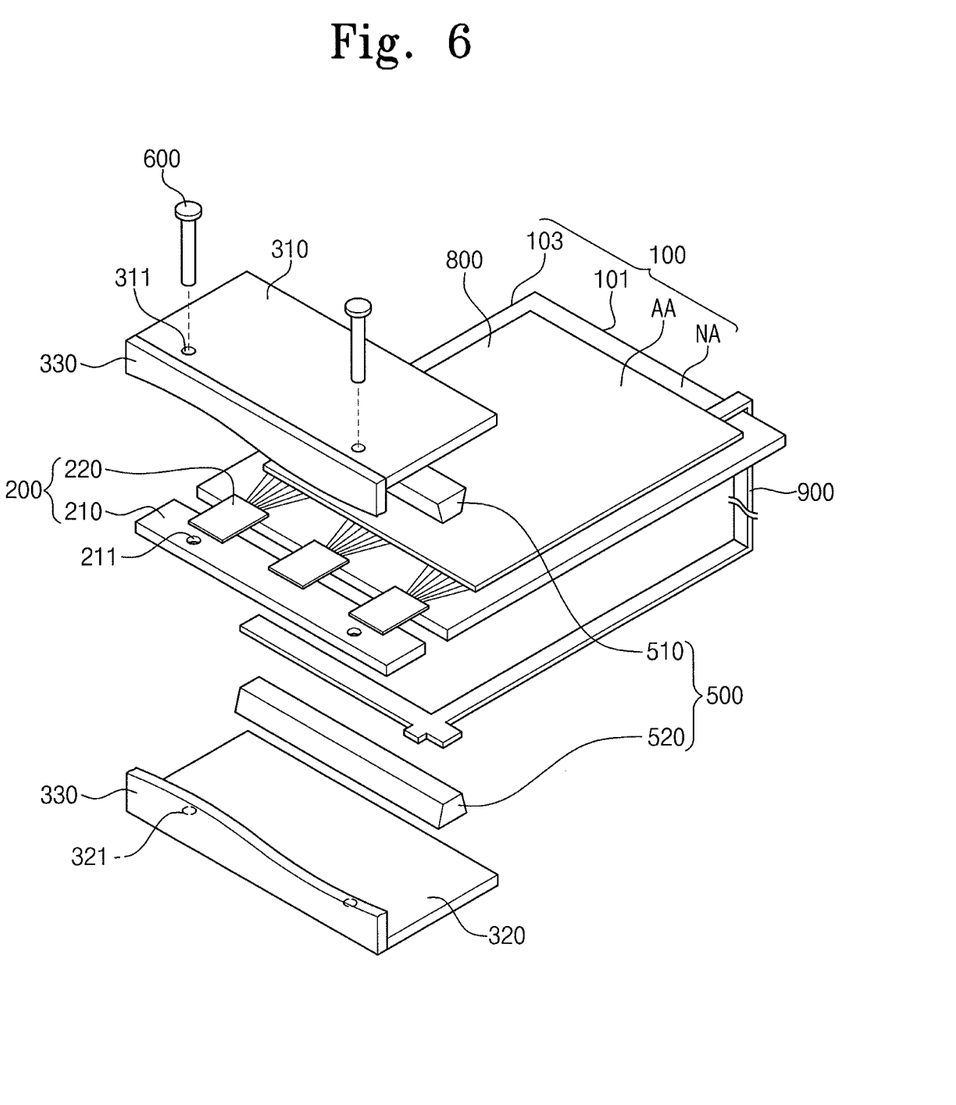
FIG. 6 illustrates an exploded perspective view of a display apparatus according to an exemplary embodiment.

FIG. 6 is an explored perspective view of a display apparatus according to still another exemplary embodiment. FIG. 7 is a top view of a display apparatus in FIG. 6. FIG. 8 is a cross-sectional view taken along a line I-I' in FIG. 6.

Figure 7:
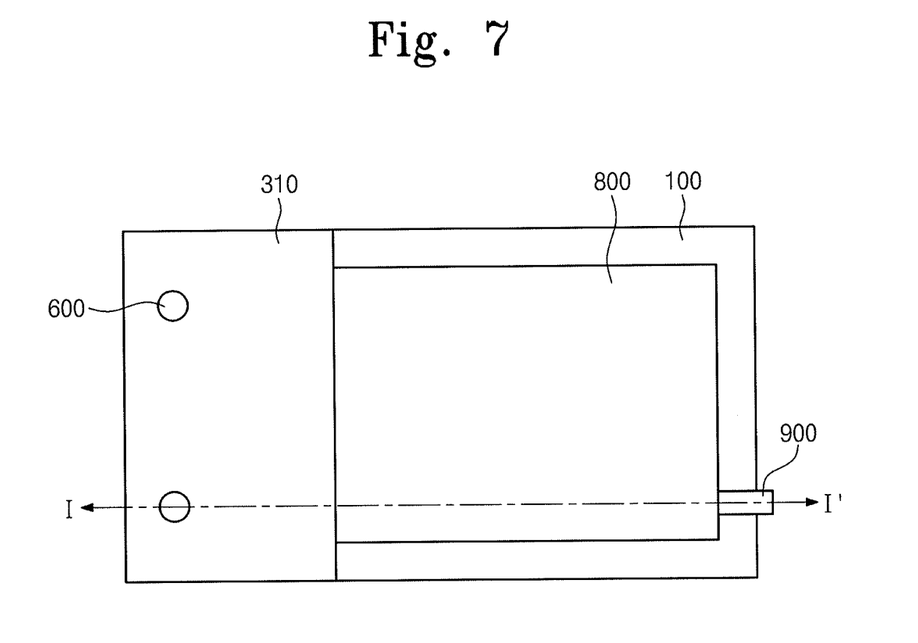
FIG. 7 illustrates a top view of the display apparatus in FIG. 6.
Figure 8:
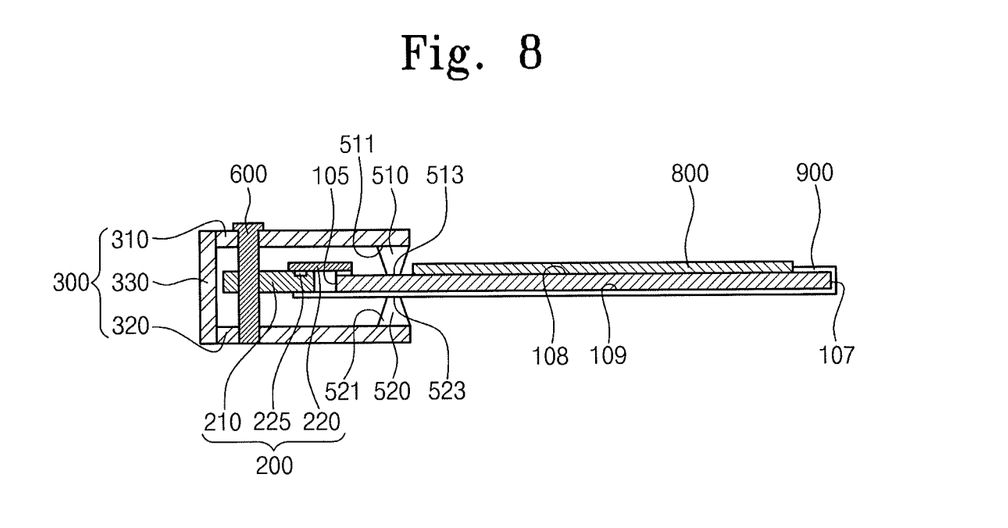
FIG. 8 illustrates a cross-sectional view taken along a line I-I' in FIG. 6.

A display apparatus illustrated in FIGS. 6 to 8 may be configured the same as a display apparatus illustrated in FIGS. 1 to 3 except that a touch panel 800 and a touch flexible printed circuit board 900 are further included. Thus, in FIGS. 6 to 8, description of constituent elements which are substantially similar to those in FIGS. 1 to 3 may be omitted.

The touch panel 800 may be disposed on a surface of a display panel 100 to at least correspond to a display area AA of the display panel 100. For example, the touch panel 800 may be disposed on the flexible display panel 100. An exemplary embodiment will be described using the case that the touch panel 800 is disposed on an upper surface 108 of the display panel 100. The touch panel 800 may detect an external touch to generate a touch location detecting signal. The touch panel 800 may include one of various structures of touch panels, e.g., one of various structures that are known in the art. For example, a capacitive touch panel or a surface acoustic touch panel may be used.

The touch flexible printed circuit board 900 may connect the touch panel and a driver printed circuit board 210 electrically. One end of the touch flexible printed circuit board 900 may be electrically connected to the touch panel 800, and the other end thereof may be electrically connected to the driver printed circuit board 210. The touch location detecting signal generated from the touch panel 800 may be transferred to the driver printed circuit board 210 via the touch flexible printed circuit board 900.

A portion extended from the one end of the touch flexible printed circuit board 900 may be bent along the short edge 101, e.g., the other surface 107 in FIG. 7, of the display panel 100. At least a part of the extended portion may be disposed on a lower surface 109 of the display panel 100. The short edge 101, e.g., the other surface 107 in FIG. 7, of the display panel 100 may be opposite to one lateral surface, e.g., lateral edge, of the display panel 100 adjacent to the driver circuit unit 200. The touch flexible printed circuit board 900 may be disposed between the lower surface 109 of the display panel 100 and a second surface 523 (see. FIG. 3) of the second fixing unit 520. The touch flexible printed circuit board 900 may be in contact with the second fixing unit 520, e.g., the touch flexible printed circuit board 900 may be between the second fixing unit 520 and the display panel 100.

Figure 9:
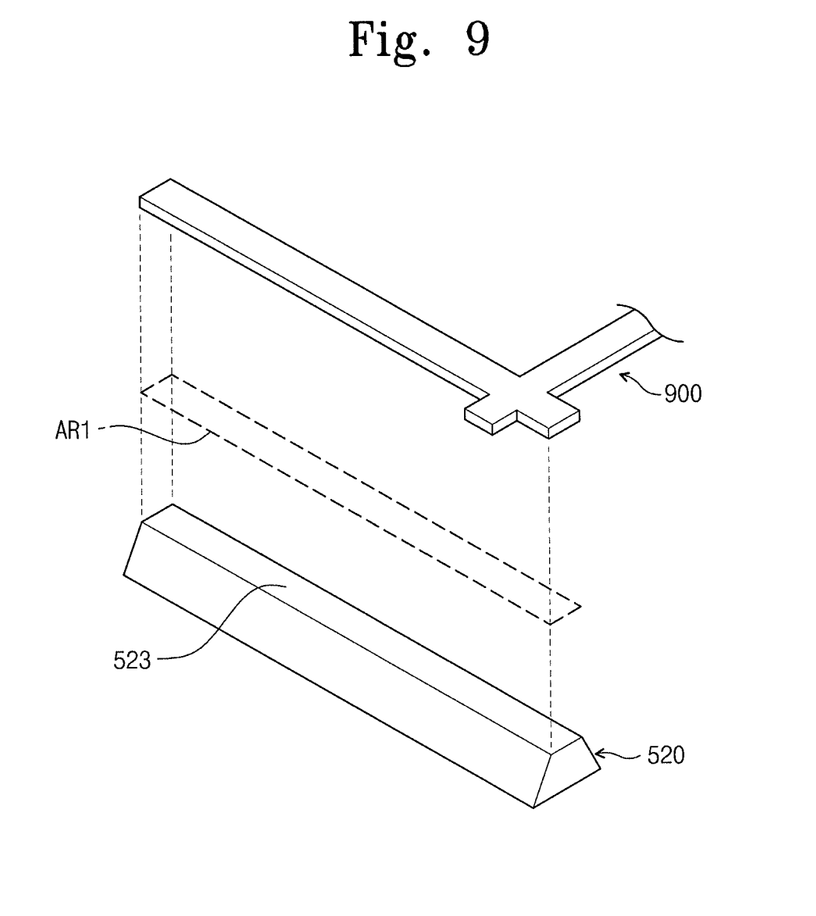
FIG. 9 illustrates a partial magnifying view of a touch flexible printed circuit board and a second fixing unit in FIG. 6.

FIG. 9 is a partial magnifying view of a touch flexible printed circuit board 900 and the second fixing unit 520 in FIG. 6.

Referring to FIG. 9, a surface of a touch flexible printed circuit board 900 may contact with the second surface 523 of the second fixing unit 520 at a first area AR1. The first area AR1 may have the same area as the second surface 523 of the second fixing unit 520 on a plane.

Although the touch flexible printed circuit board 900 is disposed between a display panel 100 and the second fixing unit 520, a step between display panel 100 and the second fixing unit 520 may be prevented by a shape of the touch flexible printed circuit board 900. Thus, the display panel 100 and the second cover member 320 may be concretely fixed by the second fixing unit 520.

In example embodiments, flexibility of the flexible display panel may be maintained by a shape of the fixing unit according to exemplary embodiments. Further, a driver circuit unit connected to the flexible display panel may be protected from an external impact.

By way of summation and review, a flexible display panel has been developed. The flexible display panel may use a flexible material such as a plastic instead of a glass. The flexible display panel may retain a display performance even when it may be bent, e.g., similar to paper. However, when a conventional flexible display panel experiences variation over a predetermined level the integrity of the display panel may be reduced. For example, the integrity of the flexible display panel may be reduced when signal lines formed at a non-display area are cracked.

In contrast, exemplary embodiments relate to maintaining the flexibility of the flexible display panel via a fixing unit. Further, embodiments relate to protecting a driver circuit unit connected to the flexible display panel from an external impact.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
 a flexible display panel including a display area that displays an image and a non-display area adjacent to at least a part of the display area;
 a driver circuit unit connected to the non-display area, the driver circuit unit driving the flexible display panel;
 a cover member covering at least a part of the driver circuit unit and at least a part of the non-display area of the flexible display panel; and
 a fixing unit spaced apart from the driver circuit unit and overlapping the non-display area, the fixing unit being between the cover member and the flexible display panel to fix the cover member and the flexible display panel,
 wherein the cover member includes a first cover member covering an upper part of the driver circuit unit, and a second cover member covering a lower part of the driver circuit unit, and
 wherein the driver circuit unit and a portion of the flexible display panel are spaced apart from the first cover member and the second cover member and are between the first cover member and the second cover member.

2. The display apparatus of claim 1, wherein the driver circuit unit includes:
 a driver printed circuit board driving the flexible display panel, and
 a main flexible printed circuit board mounted at the driver printed circuit board and connected to the flexible display panel to transfer an electric signal output from the driver printed circuit board to the flexible display panel.

3. The display apparatus of claim 2, further comprising a third cover member covering a lateral side of the driver circuit unit, the third cover member connecting the first cover member and the second cover member.

4. The display apparatus of claim 3, wherein the first, the second, and the third cover members are integrally formed into one unit as one continuous piece.

5. The display apparatus of claim 3, further comprising a connection unit connecting the first cover member, the second cover member, and the third cover member via the first cover member, the second cover member, and the driver printed circuit board.

6. The display apparatus of claim 5, wherein the first, the second, and the third cover members and the connection unit include a metallic material.

7. The display apparatus of claim 5, wherein the connection unit is connected to a ground.

8. The display apparatus of claim 5, wherein the connection unit passes through connection holes in the first cover member, the driver printed circuit board, and the second cover member.

9. The display apparatus of claim 1, wherein the fixing unit includes:
- a first fixing unit between the first cover member and the flexible display panel, the first fixing unit fixing the first cover member and the flexible display panel, and
- a second fixing unit between the second cover member and the flexible display panel, the second fixing unit fixing the second cover member and the flexible display panel.

10. The display apparatus of claim 9, wherein the first and second fixing units include a nonconductive material.

11. The display apparatus of claim 9, wherein the first fixing unit includes:
- a first surface adjacent to the first cover member, and
- a second surface adjacent to the flexible display panel, an area of the first surface being greater than an area of the second surface.

12. The display apparatus of claim 11, wherein the first fixing unit has a quadrangular pyramid shape.

13. The display apparatus of claim 9, wherein the first fixing unit has a semicircular pillar shape having a first surface of a rectangular shape, the first surface contacting the first cover member.

14. The display apparatus of claim 9, wherein the second fixing unit includes:
- a first surface adjacent to the second cover member, and
- a second surface adjacent to the flexible display panel, an area of the first surface being greater than an area of the second surface.

15. The display apparatus of claim 14, wherein the first fixing unit has a quadrangular pyramid shape.

16. The display apparatus of claim 14, further comprising:
- a touch panel on at least one surface of the flexible display panel, the touch panel corresponding to the display area and detecting an external touch; and
- a touch flexible printed circuit board connecting the touch panel and the driver printed circuit board,
- wherein the flexible display panel includes one surface adjacent to the driver circuit unit and another surface opposite the one surface, the touch flexible printed circuit board being bent along the other surface of the flexible display panel, and at least a part of the touch flexible printed circuit board being on the other surface of the flexible display panel and being in contact with the second fixing unit.

17. The display apparatus of claim 16, wherein the touch flexible printed circuit board is between a lower surface of the flexible display panel and the second surface of the second fixing unit.

18. The display apparatus of claim 17, wherein one surface of the touch flexible printed circuit board is in contact with the second surface of the second fixing unit at a first area, the first area having a same area as the area of the second surface of the fixing unit.

19. The display apparatus of claim 9, wherein the second fixing unit has a semicircular pillar shape having a first surface of a rectangular shape, the first surface contacting the second cover member.

20. The display apparatus of claim 9, wherein the first fixing unit and the second fixing unit are symmetrically shaped and symmetrically aligned with one another on opposite sides of the flexible display panel.

* * * * *